United States Patent [19]
Campbell

[11] Patent Number: 6,060,926
[45] Date of Patent: May 9, 2000

[54] PULSE CONDITIONING CIRCUIT

[75] Inventor: David E. Campbell, Mountain View, Calif.

[73] Assignee: American Meter Company, Scott Depot, W. Va.

[21] Appl. No.: 09/021,075

[22] Filed: Feb. 1, 1998

[51] Int. Cl.[7] .............................................. H03K 3/3568
[52] U.S. Cl. ........................................ 327/208; 327/221
[58] Field of Search ................................... 327/199, 200, 327/202, 203, 205, 206, 208, 218, 219, 221, 222; 324/419

[56] References Cited

U.S. PATENT DOCUMENTS

| | | | |
|---|---|---|---|
| 3,946,208 | 3/1976 | Borgstrom | 235/92 |
| 4,282,513 | 8/1981 | Meisner et al. | 340/149 |
| 4,579,008 | 4/1986 | Bohm et al. | 73/861.78 |
| 4,793,192 | 12/1988 | Jerger et al. | 73/861.78 |
| 4,806,786 | 2/1989 | Valentine | 327/203 |
| 5,212,410 | 5/1993 | Sase | 327/205 |
| 5,317,895 | 6/1994 | Ogawa et al. | 73/3 |
| 5,447,062 | 9/1995 | Kopl et al. | 73/261 |
| 5,451,937 | 9/1995 | Olson et al. | 340/870.3 |
| 5,886,541 | 3/1999 | Asato | 327/219 |

Primary Examiner—Tuan T. Lam
Attorney, Agent, or Firm—Rhodes & Mason, P.L.L.C.

[57] ABSTRACT

The present invention relates to a pulse conditioning circuit including a first switch terminal having a first leg connected to a DC power source and a second leg. A second switch terminal is also provided having a first leg connected to an electrical ground and a second leg electrically connected to the second leg of the first switch. Pulses resulting from switch closures at the switch terminals are provided at the node where the second legs of both switch terminals are coupled. This node is preferably coupled to a low-pass filter, which is further coupled to a latch circuit providing a conditioned pulse output. The latch circuit is adapted to provide a first logic state output when the input of the latch is provided with a high logic state and a second logic state output when the input of the latch is provided with a low logic state. The high logic state input is provided when a switch connected to the first switch terminal is closed. Likewise, the low logic state input is provided when a switch associated with the second switch terminal is closed.

19 Claims, 4 Drawing Sheets

PULSE CONDITIONING CIRCUIT

BACKGROUND OF THE INVENTION

1. Field of the Invention

The present invention relates generally to a pulse conditioning circuit and, more particularly, to an improved pulse conditioning circuit in battery-powered flow meters for conditioning input pulses and minimizing power consumption.

2. Description of the Prior Art

Battery-powered, natural gas flow meters, such as those sold by American Meter Company, calculate volumetric flow by compensating raw volume data based upon temperature and pressure measurements. The raw volume data is typically determined by monitoring a pulse output from a volumetric meter placed in the natural gas pipeline. The meter may have an impeller or other mechanical means (such as a diaphragm and chamber system), which turns or cycles as the natural gas flows through the meter. The impeller or mechanical means is connected to a shaft which turns as the natural gas flows through the meter. Most meters include a mechanical index connected to the shaft to provide a mechanical history of the gas flow.

Generally, the shaft also includes one or more magnets oriented to pass within close proximity of one or more reed switches fixed in the index. The reed switch or switches are electronically arranged to provide pulses to conditioning circuitry as the magnet(s) on the index shaft rotates by the reed switch(es). These pulses provide the electronic flow meter raw flow data for electronic compensation. Problems with prior electrical conditioning circuits include miscount due to switch bounce when the magnet-switch proximity is such to cause a premature switch closure, meter stoppage and shaft reversal, and interference or noise. Noise is of utmost concern in high-impedance, low power applications inherent in battery powered meters. Additionally, prior art circuit designs fail to minimize current consumption to the extent of the present invention, thereby reducing battery life.

In one prior art solution, a single reed switch design has been used for conditioning a switch closure using a passive low pass filter into a gate with hysteresis. However, the single reed switch design does not prevent or eliminate miscount due to meter stoppage and reversal. Further, the single reed switch design allows current to continue to flow through a resistor in the conditioning circuit as long as the reed switch is closed, thereby allowing unnecessary current consumption, which reduces battery life (see FIG. 1).

Another prior art solution employs a dual reed switch design with cross-coupled feedback without filter capacitors. This basic circuit topology provides a "set/reset" flip-flop such that the flip-flop can be set only after it has been reset. The set/reset actions correspond to the consecutive closings of the two reed switches. While the dual reed switch design prevents some miscount due to meter stoppage and reversal, it does not eliminate miscount due to RF interference (see FIG. 2). If filter capacitors are added to improve interference performance, the capacitors act to slow down the latching action of the flip-flop. Thus, if a switch does not stay closed long enough to allow the flip-flop to latch, a miscount may occur (see FIG. 2).

Thus, there remains a need for an electrical pulse conditioning circuit for battery powered flow meters which (a) reliably counts the number of rotational pulse input signals so that the data may be saved for later use, (b) prevents miscount due to meter stoppage and reverse rotation, (c) prevents miscount due to interference or noise from high frequencies, and (d) consumes a minimum current to maximize battery life.

SUMMARY OF THE INVENTION

The present invention is directed to an electrical pulse conditioning circuit for various types of low-powered flow meters. The circuit preferably monitors switch closures to provide a pulse output, which meets all of the design requirements stated in the foregoing, with fewer components than any design known by the applicant.

The pulse conditioning circuit preferably includes a first switch terminal having a first leg connected to a DC power source and a second leg. A second switch terminal is also provided having a first leg connected to an electrical ground and a second leg electrically connected to the second leg of the first switch. In other words, the switch terminals are placed in series between power and ground. Pulses resulting from switch closures at the switch terminals are provided at the node where the second legs of both switch terminals are coupled. This node is preferably coupled to a low-pass filter, which is further coupled to a latch circuit providing a conditioned pulse output.

The latch circuit is adapted to provide a first logic state output when the input of the latch is provided with a high logic state and a second logic state output when the input of the latch is provided with a low logic state. The high logic state input is provided when a switch connected to the first switch terminal is closed. Likewise, the low logic state input is provided when a switch associated with the second switch terminal is closed. Preferably, the switches associated with these terminals are so arranged as not to concurrently close during operation. Preferably, the switches are oppositely mounted on the rotating shaft of the meter. With this arrangement, a magnet on the shaft will never be in a position capable of closing both switches at the same time.

The latch circuit preferably includes two inverters placed in electrical series between the latch input and the latch output wherein feedback is provided from the latch output to the latch input. With this configuration, a switch closure at the first switch terminal following a switch closure at the second switch terminal provides the high logic state at the latch input, and a switch closure at the second switch terminal following a switch closure at the first switch terminal provides the low logic state at the latch input. Consecutive switch closures at one switch terminal without a closure at the other switch terminal will not result in a state change at the output of the latch, thereby preventing miscount due to switch bounce or shaft reversal.

The inverters will generally include hysteresis and will be capable of operating at relatively low power. The circuit operates to minimize current flow through the circuit by limiting current flow to state changes, even if a switch remains closed for an extended period of time. The filter circuit is preferably an RC network designed to prevent electrical noise and switch bounce from generating spurious pulses at the latch input.

These and other aspects of the present invention will become apparent to those skilled in the art after a reading of the following description of the preferred embodiment when considered with the drawings.

DESCRIPTION OF THE PREFERRED EMBODIMENTS

Figure 1:
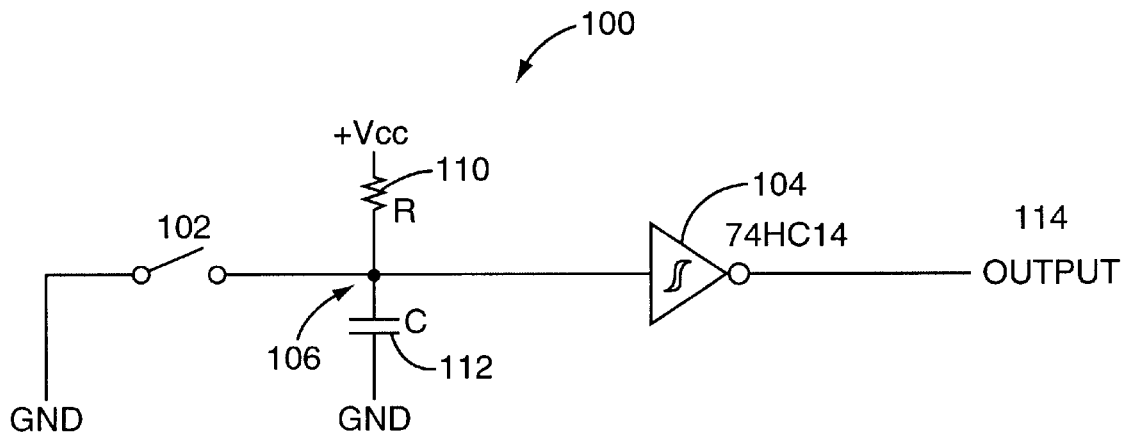
FIG. 1 is a schematic diagram of a first pulse conditioning circuit in the prior art.

In the following description, like reference characters designate like or corresponding parts throughout the several views. FIG. 1 depicts a classic design for de-bouncing a switch closure using a passive low-pass filter and a gate with hysteresis. In particular, the circuit 100 includes a switch 102 having one leg connected to ground (gnd) and the other leg providing an input to the gate 104. The RC filter network 106 is tied between power (Vcc) and ground, and operates to filter out high-frequency switch bounce likely to occur during initial closure and release of the switch 102.

The resistor 110 operates to hold the input of gate 104 high when switch 102 is open. The capacitor 112 and resistor 110 are chosen to filter out switch bounce while passing switch closures during normal operation. If the gate 104 is an inverter as shown in FIG. 1, the output 114 of the circuit 100 will be low when the switch 102 is open. The input of the gate 104 will be pulled high by the resistor 110 resulting in a logic low at output 114. When switch 102 is closed, the input of gate 104 is pulled low, and capacitor 112 discharges to ground. The output of gate 104 will then switch to a logic high. Since the circuit 100 of FIG. 1 is a single switch design, meter stoppage and shaft reversal may lead to miscount. Furthermore, this circuit design is not well suited to low-power embodiments, since current will continue to flow through resistor 110 as long as the switch 102 is closed.

Figure 2:
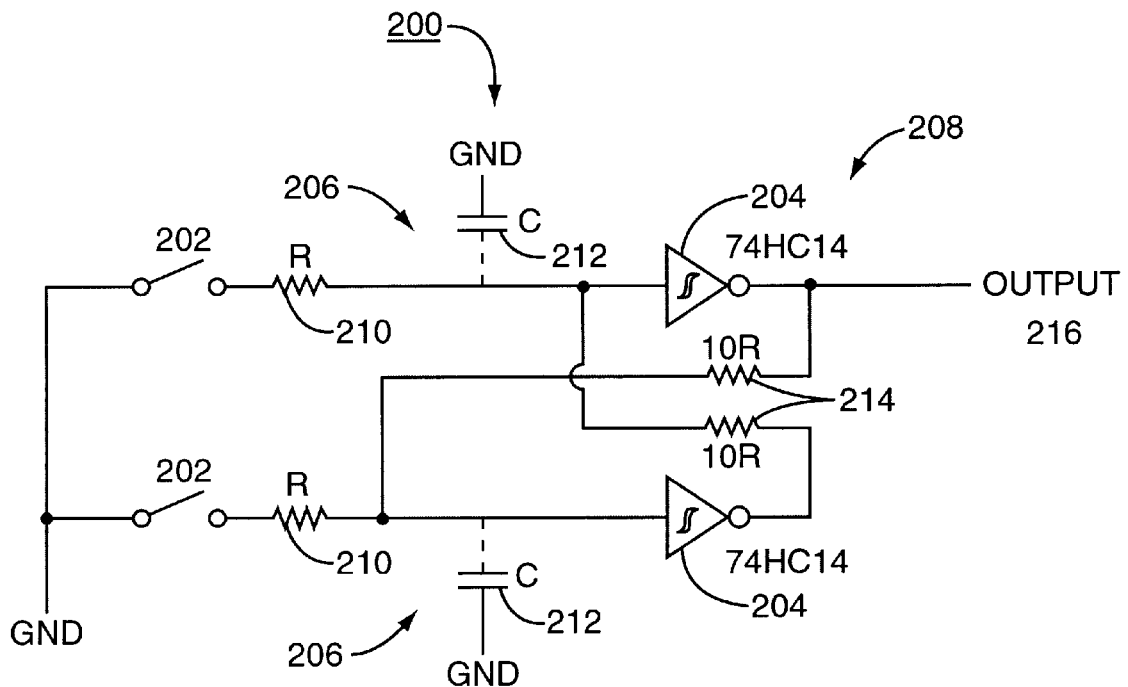
FIG. 2 is a schematic diagram of a second pulse conditioning circuit in the prior art.

FIG. 2 illustrates a dual-reed switch design 200 of the prior art, including two switches 202, each having a leg connected to ground. The other legs for the switches are coupled to an RC low-pass filter 206 having a series resistor 210 and a capacitor 212 coupled to ground. The output of each filter 206 is coupled to the respective inputs of a set/reset flip-flop, preferably comprised of two inverters 204 and two cross-coupled feedback resistors 214 connecting the output of one inverter 204 to the input of the other. The set/reset topology helps eliminate miscount due to meter stoppage and reversal because the flip-flop 208 can only be set after it has been reset. The set and reset actions correspond to the sequential closing of the two switches 202. Multiple closures of one switch 202, without the closure of the other switch 202, will not result in a change in the output of the flip-flop 208.

The design of FIG. 2 is susceptible to high-frequency interference because of the high-input impedance of the circuit 200, especially if filter capacitors 212 are not used. Preferably, a front-end circuit will have a low-input impedance at high frequencies, especially those in the RF range. Another difficulty with the circuit 200 shown in FIG. 2 is that the filtering capacitors 212 act to slow down the latching action of the flip-flop, and in certain situations, when one of the switches does not stay closed long enough to allow the flip-flop to latch, a miscount occurs.

Figure 3:
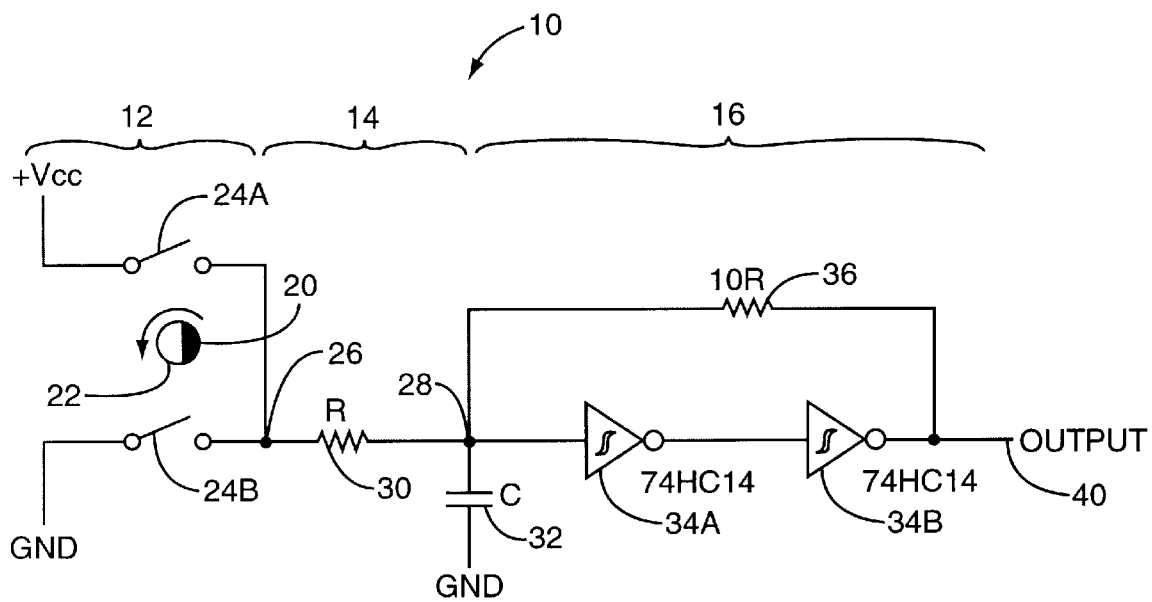
FIG. 3 is a schematic diagram of a pulse conditioning circuit according to the preferred embodiment of the present invention.
Figure 4:
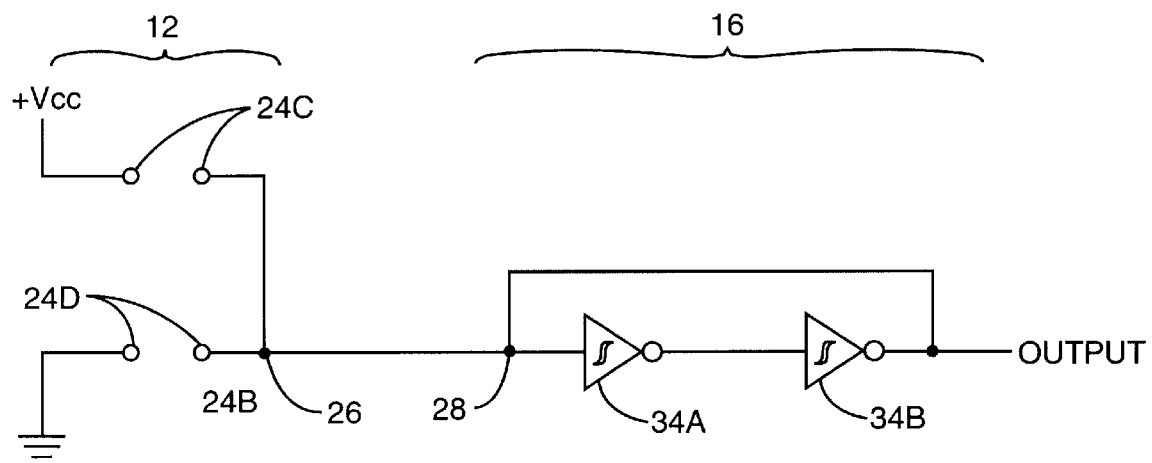
FIG. 4 is a schematic diagram of a pulse conditioning circuit according to the present invention.

Referring now to the present invention shown in FIGS. 3–5, it will be understood that the illustrations are for the purpose of describing preferred embodiments of the invention and are not intended to limit the invention thereto. As best seen in FIG. 3, a pulse conditioning circuit, generally designated 10, is shown according to the present invention. The pulse conditioning circuit 10 comprises switch circuitry 12, filter circuitry 14, and latch circuitry 16 electrically connected in series wherein a signal corresponding to gas flow is generated by having a magnet 20 coupled to a rotating shaft 22 of a pulser (not shown) by closing one of the switches 24A, 24B.

As the shaft 22 rotates, the magnet 20 sequentially passes by the switches 24A and 24B. As the magnet approaches the respective switch 24A, 24B, the switch will close and pull node 26 to Vcc (logic high) if switch 24A is closed, or ground (logic low) if switch 24B is closed. Node 26 is coupled to the filter circuit 14, which typically includes a series resistor 30 and a capacitor 32 coupled to ground, although any filtering circuitry adapted to eliminate bounce and noise is acceptable. Node 28 represents the output of the filter circuitry 14 and the input of the latch circuitry 16. Preferably, the latch circuitry includes two series inverters with hysteresis 34A, 34B and a feedback resistor 36 coupling the output of inverter 34B to the input of inverter 34A at node 28. However, virtually any configuration of logic to provide a buffering is acceptable.

In operation, the latch circuitry 16 operates as a set/reset latch having a single input. Notably, during periods when both switches 24A, 24B are open, the latch circuitry will maintain the state of the last switch closure without drawing any excess current. During a state change initiated by a switch closure, the state change propagates through the latch circuitry 16 from node 28 to the output 40. Feedback through resistor 36 acts to hold node 28 in the new state even after the switch opens. Furthermore, additional closures of the switch causing the state change, before a switch closure at the other switch causing a new state change, will not cause a state change at the latch output 40.

Figure 5A:
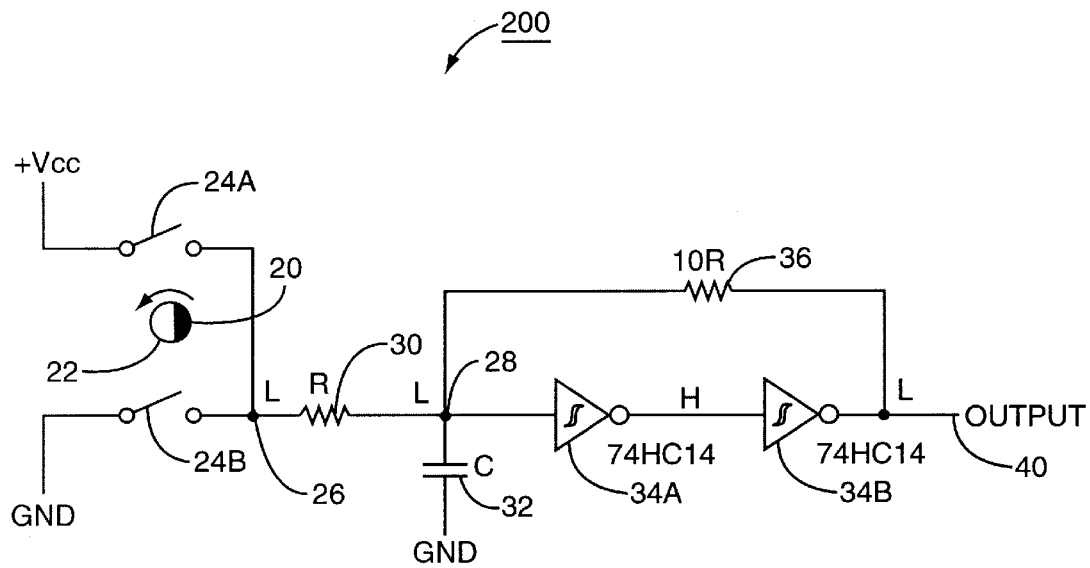
FIGS. 5(a), 5(b), 5(c), and 5(d) are a series of schematic diagrams detailing the operation of the pulse conditioning circuit of FIG. 3.

Operation of the circuit is best understood in view of FIGS. 5a–5d, where operation of the circuit throughout a complete cycle of state changes is shown. For ease of understanding, FIG. 5a is shown with the magnet 20 in a position where both switches 24A and 24B are open. Furthermore, the conditioning circuitry 200 is shown in a steady state wherein the output 40 is at a logic low, designated (L). With the output 40 at a logic low, node 28 is driven low through the feedback resistor 36. The output of inverter 34A is a logic high, which in turn drives the output of inverter 34B to a logic low. At this state, the capacitor 32 is discharged and no current flows through resistor 30.

Figure 5B:
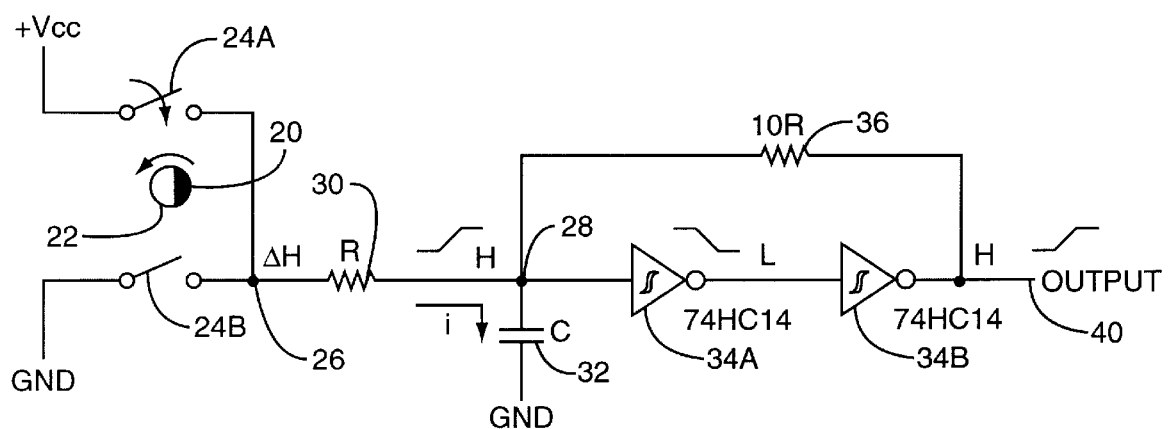
Figure 5C:
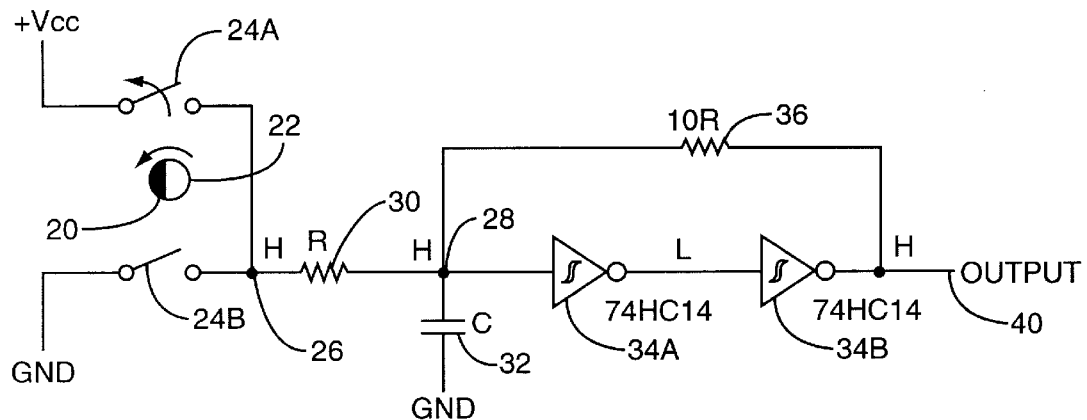

As the shaft 22 and magnet 20 rotate counterclockwise, switch 24A will close as shown in FIG. 5b. When switch 24A is closed, node 26 is tied to Vcc and takes on a logic high. Current will flow through resistor 30 and charge capacitor 32, thereby bringing node 28 to a logic high. The high state of node 28 is propagated through the inverters 34A and 34B to drive the output 40 to a high logic state. Feedback through resistor 36 maintains node 28 at a logic high regardless of the state of switch 24A. The output 40 will not change even if switch 24A opens or bounces during the rotation of the shaft 22 and magnet 20. As shown in FIG. 5c, when switch 24A opens, nodes 26 and 28 remain at a high logic state, along with output 40. Notably, no excess current is drawn through the feedback resistor 36 or resistor 30 of the filter circuitry 14.

Figure 5D:
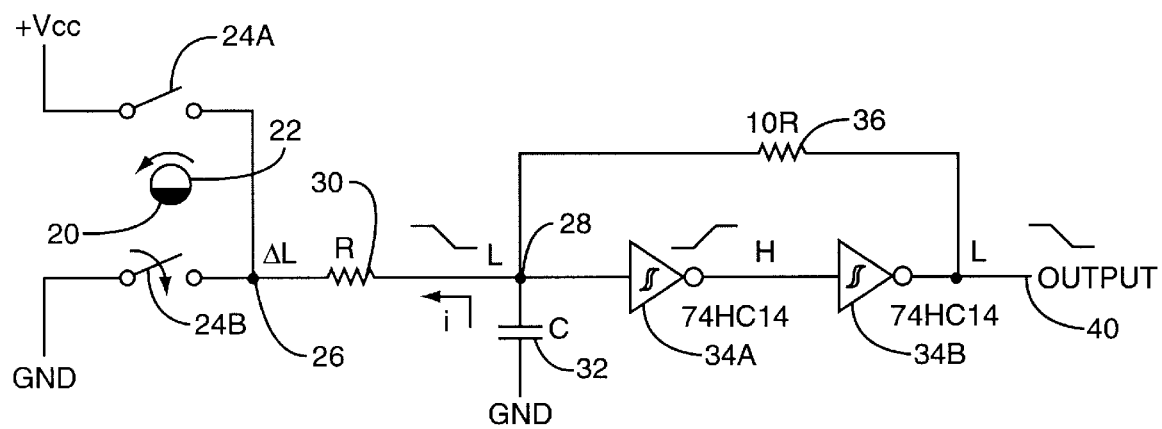

FIG. 5d depicts the continued counterclockwise rotation of the shaft 22 and magnet 20 to a position where switch 24B is closed. When switch 24B closes, node 26 is pulled to ground (a logic low), and capacitor 32 discharges through resistor 30. As the capacitor 32 discharges, node 28 is pulled to a logic low. When node 28 is a logic low, the output of inverter 34A is a logic high and the output of inverter 34B is a logic low, thereby providing a logic low at output 40. The output 40 holds node 28 at a logic low through the feedback resistor 36. The output is not affected by subsequent bounce or switch closure at switch 24B. This circuit is now in the stable state shown in FIG. 5a wherein the process repeats itself as the shaft and magnet continue to rotate. Each full revolution of the shaft provides a pulse at output 40. Given the series connection of the switches 24A and 24B, care must be taken to ensure that switches 24A and 24B will not concurrently close during operation. Certain modifications and improvements will occur to those skilled in the art upon a reading of the foregoing description. By way of example, as best seen in FIG. 4, the switch circuitry 12 and latch circuitry 16 may be electrically coupled in series without the filtering circuitry 14. Switches 24A and 24B may also be directly connected to switch terminals 24C and 24D located on a printed circuit board with the other conditioning circuitry instead of being mounted on the index and connected to the terminals. In such an arrangement, the switches are mounted proximate to the shaft and include leads for connection to the terminals. Furthermore, other switch and actuation means may be used instead of reed switches, such as magnets, photo cells or resistors and optical actuation means to name a few acceptable options. It should be understood that all such modifications and improvements have been deleted herein for the sake of conciseness and readability but are properly within the scope of the following claims.

What is claimed is:

1. A low-power pulse conditioning circuit comprising:
   a. a first switch terminal having a first leg for electrical connection to a DC power source and a second leg;
   b. a second switch terminal having a first leg for electrical connection to ground and a second leg electrically coupled to said second leg of said first switch terminal; and
   c. a latch circuit having an output and an input electrically coupled to said second legs of said switch terminals;
   d. said latch circuit providing at said output a first logic state output when said input is provided with a high logic state and a second logic state output when said input is provided with a low logic state;
   e. a filter circuit in series between said input of said latch circuit and said second legs of said switch terminals; and
   f. wherein a switch closure at said first switch terminal following a switch closure at said second switch terminal provides said high logic state at said input of said latch circuit, a switch closure at said second switch terminal following a switch closure at said first switch terminal provides said low logic state at said input of said latch circuit, and consecutive switch closures at one said switch terminal without closure of the other said switch terminal will not result in a state change at said output of said latch.

2. The circuit of claim 1 wherein said latch circuit includes two inverters connected in series between said input of said latch circuit and said output of said latch circuit, and a feedback circuit electrically connecting said output and said input of said latch circuit.

3. The circuit of claim 2 wherein said feedback circuit includes a resistor.

4. The circuit of claim 1 wherein said filter circuit is a low-pass filter.

5. The circuit of claim 4 wherein said filter circuit includes a capacitor coupled between said ground and said input of said latch circuit and a resistor coupled in series between said input of said latch circuit and said second legs of said switch terminals.

6. The circuit of claim 1 wherein each said switch terminal includes a switch electrically coupled between said respective first and second legs.

7. The circuit of claim 6 wherein said switches are magnetic reed switches.

8. The circuit of claim 6 wherein said switches are so arranged as not to concurrently close.

9. The circuit of claim 6 wherein one said switch will not close while the other said switch is closed.

10. The circuit of claim 1 wherein said first logic state output is a logic high.

11. The circuit of claim 1 wherein said second logic state output is a logic low.

12. The circuit of claim 2 wherein said inverters are inverters with hysteresis.

13. The circuit of claim 1 wherein said latch circuit comprises low-power components.

14. A low power pulse conditioning circuit comprising:
   a. a first normally open switch coupled to a first switch terminal having a first leg for electrical connection to a DC power source and a second leg;
   b. a second normally open switch coupled to a second switch terminal having a first leg for electrical connection to ground and a second leg electrically connected to said second leg of said first switch, said first and second switches so arranged as not to concurrently close;
   c. a latch circuit having an output and an input electrically coupled to said second legs of said switch terminals;
   d. a low-pass filter circuit in series between said input of said latch circuit and said second legs of said switches;
   e. said latch circuit providing a high logic state output when said input is provided with a high logic state and a low logic state output when said input is provided with a low logic state; and
   f. wherein a switch closure at said first switch terminal following a switch closure at said second switch terminal provides said high logic state at said input of said latch circuit, a switch closure at said second switch terminal following a switch closure at said first switch terminal provides said low logic state at said input of said latch circuit, and consecutive switch closures at one said switch terminal without closure of the other said switch terminal will not result in a state change at said output of said latch.

15. The circuit of claim 14 wherein said latch circuit includes two inverters connected in series between said input of said latch circuit and said output of said latch circuit and a feedback circuit electrically coupling said output and said input of said latch circuit.

16. The circuit of claim 14 wherein said latch circuit has hysteresis.

17. The circuit of claim 14 wherein said latch circuit includes a buffer.

18. The circuit of claim 17 wherein said buffer includes hysteresis.

19. A low power pulse conditioning circuit comprising:
   a. a first switch terminal having a first leg for electrical connection to a DC power source and a second leg;

b. a second switch terminal having a first leg for electrical connection to ground and a second leg electrically connected to said second leg of said first switch terminal, wherein said switch terminals are so arranged as not to concurrently close; and c. a latch circuit having an output and an input electrically coupled to said second legs of said switch terminals;

d. said latch circuit including two inverters connected in series between said input of said latch circuit and said outpout of said latch circuit and a feedback circuit electrically coupling said output and said input of said latch circuit;

e. said latch circuit providing a high logic state output when said input is provided with a high logic state and a low logic state output when said input is provided with a low logic state;

f. a filter circuit coupled in between said output of said latch circuit and said second legs of said switch terminals; and g. wherein a switch closure at said first switch terminal following a switch closure at said second switch terminal provides said high logic state at said input of said latch circuit, a switch closure at said second switch terminal following a switch closure at said first switch terminal provides said low logic state at said input of said latch circuit, and consecutive switch closures at one said switch terminal without closure of the other said switch terminal will not result in a state change at said output of said latch.

* * * * *

UNITED STATES PATENT AND TRADEMARK OFFICE
CERTIFICATE OF CORRECTION

PATENT NO : 6,060,926
DATED : May 9, 2000
INVENTOR(S): David E. Campbell

It is certified that error appears in the above-identified patent and that said Letters Patent is hereby corrected as shown below:

The correct filing date of this patent application should be February 10, 1998.

Signed and Sealed this

Sixth Day of March, 2001

Attest:

NICHOLAS P. GODICI

Attesting Officer     Acting Director of the United States Patent and Trademark Office